(12) United States Patent
Hano et al.

(10) Patent No.: US 10,447,182 B2
(45) Date of Patent: Oct. 15, 2019

(54) CONTROL DEVICE AND METHOD FOR BRUSHLESS MOTOR

(71) Applicant: Hitachi Automotive Systems, Ltd., Hitachinaka-shi, Ibaraki (JP)

(72) Inventors: Masaki Hano, Isesaki (JP); Naoki Okamoto, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/759,695

(22) PCT Filed: Oct. 3, 2017

(86) PCT No.: PCT/JP2017/036005
§ 371 (c)(1),
(2) Date: Mar. 13, 2018

(87) PCT Pub. No.: WO2018/066566
PCT Pub. Date: Apr. 12, 2018

(65) Prior Publication Data
US 2019/0052198 A1    Feb. 14, 2019

(30) Foreign Application Priority Data
Oct. 4, 2016  (JP) ................................. 2016-196679

(51) Int. Cl.
*H02P 6/08*     (2016.01)
*H02P 6/182*    (2016.01)
(Continued)

(52) U.S. Cl.
CPC .......... *H02P 6/08* (2013.01); *G01R 19/16547* (2013.01); *H02P 6/182* (2013.01);
(Continued)

(58) Field of Classification Search
CPC .... H02P 6/08; H02P 6/28; H02P 29/66; H02P 6/182; H02P 23/0027; H02P 27/085;
(Continued)

(56) References Cited

U.S. PATENT DOCUMENTS

2009/0256505 A1* 10/2009 Maeda ...................... H02P 6/08
318/400.07
2013/0272899 A1* 10/2013 Takahata ................. H02P 6/182
417/44.11

(Continued)

FOREIGN PATENT DOCUMENTS

JP    2004-353624 A    12/2004
JP    2007-202294 A     8/2007
(Continued)

OTHER PUBLICATIONS

International Preliminary Report on Patentability (PCT/IB/338 & PCT/IB/373) issued in PCT Application No. PCT/JP2017/036005 dated Apr. 18, 2019, including English translation of document C2 (Japanese-language Written Opinion (PCT/ISA/237) previously filed on Mar. 13, 2018) (13 pages).
(Continued)

*Primary Examiner* — Bickey Dhakal
*Assistant Examiner* — Zemenay T Truneh
(74) *Attorney, Agent, or Firm* — Crowell & Moring LLP

(57) ABSTRACT

The present invention provides a control device and a control method for a brushless motor, including energization modes for selecting a phase to be energized by pulse width modulation operation from among phases of the brushless motor, and being provided for controlling the rotation speed of the brushless motor by switching between the energization modes based on comparison of a voltage induced in a non-energized phase with its threshold value. In the control device and method, the input voltage of the brushless motor
(Continued)

is increased when the duration for which the induced voltage is maintained unchanged or the duration for which the current energization mode is maintained employed reaches a predetermined time. This prevents the brushless motor from being staying in the stopped state, even when the load on the brushless motor abruptly increases while the brushless motor rotates at a speed within an extremely low speed range.

5 Claims, 10 Drawing Sheets

(51) Int. Cl.
| | |
|---|---|
| H02P 27/08 | (2006.01) |
| H02P 29/66 | (2016.01) |
| G01R 19/165 | (2006.01) |
| H02P 6/28 | (2016.01) |
| H02P 23/00 | (2016.01) |
| H02P 25/026 | (2016.01) |
| H02P 23/14 | (2006.01) |
| H02P 25/03 | (2016.01) |

(52) U.S. Cl.
CPC ............ *H02P 6/28* (2016.02); *H02P 23/0027* (2013.01); *H02P 27/085* (2013.01); *H02P 29/66* (2016.02); *H02P 23/14* (2013.01); *H02P 25/026* (2013.01); *H02P 25/03* (2016.02)

(58) Field of Classification Search
CPC ........ H02P 23/14; H02P 25/026; H02P 25/03; G01R 19/16547
USPC .................................. 318/400.34; 417/44.11
See application file for complete search history.

(56) References Cited

U.S. PATENT DOCUMENTS

| | | | |
|---|---|---|---|
| 2014/0203743 A1* | 7/2014 | Okamoto | H02P 6/153 318/400.14 |
| 2014/0217936 A1* | 8/2014 | Okamoto | H02P 6/182 318/400.13 |
| 2018/0175752 A1* | 6/2018 | Takeoka | F25B 49/02 |

FOREIGN PATENT DOCUMENTS

| | | |
|---|---|---|
| JP | 2008-29122 A | 2/2008 |
| JP | 2009-189176 A | 8/2009 |
| JP | 2015-15788 A | 1/2015 |

OTHER PUBLICATIONS

Japanese-language International Search Report (PCT/ISA/210) issued in PCT Application No. PCT/JP2017/036005 dated Jan. 9, 2018 (three (3) pages).

Japanese-language Written Opinion (PCT/ISA/237) issued in PCT Application No. PCT/JP2017/036005 dated Jan. 9, 2018 with English translation (eight (8) pages).

* cited by examiner

CONTROL DEVICE AND METHOD FOR BRUSHLESS MOTOR

TECHNICAL FIELD

The present invention relates to a control device and to a control method for controlling the rotation speed of a brushless motor based on comparison of a voltage induced in a non-energized phase with a threshold value by switching between a plurality of energization modes for selecting phases to be energized by pulse width modulation operation from among the plurality of phases of the brushless motor.

BACKGROUND ART

Patent Document 1 discloses a drive system of a synchronous motor. The drive system includes a three-phase synchronous motor, an inverter, and a controller. The inverter is connected to the three-phase synchronous motor and includes a plurality of switching elements. The controller controls energization of the inverter by pulse width modulation operation according to six energization modes each for selecting two phases to be energized from among the three-phase coils of the three-phase synchronous motor. The drive system sequentially switches between the energization modes in accordance with the comparison result between a reference voltage and the detected value of the terminal potential (induced voltage or transformer electromotive force) of a non-energized phase.

REFERENCE DOCUMENT LIST

Patent Document

Patent Document 1: JP 2009-189176 A

SUMMARY OF THE INVENTION

Problem to be Solved by the Invention

For example, a system for controlling the rotation speed of a brushless motor according to sensorless control for switching between energization modes based on a voltage induced in a non-energized phase has a risk of stopping the brushless motor in the following situation. Here, the brushless motor serves as an actuator of an electric water pump for circulating cooling water for an internal combustion engine. For example, when foreign matter is trapped in the pump unit of the electric water pump while the command value of the rotation speed is extremely low (in the vicinity of 100 rpm to 200 rpm, for example), the load on the electric water pump abruptly increases. In such a case, sometimes the feedback control is not performed in a timely manner in response to the resultant drop in the motor rotation speed, and the brushless motor may stop. When the motor stops, the energization mode switching is suspended. Thus, when the motor rotation speed is measured by calculation based on the energization mode switching frequency, if the most recent measurement data of the motor rotation speed before the motor stops is higher than the command value, the measurement data is maintained unchanged from this last updated value, which is higher than the command value. As a result, the input voltage for the motor is controlled to be reduced, and the motor stays in the stopped state.

The present invention has been made in view of the above problem, and it has an object to provide a control device and a control method for a brushless motor which is capable of preventing the brushless motor from staying in the stopped state, even when the load on the brushless motor abruptly increases while the brushless motor rotates at a speed within an extremely low speed range.

Means for Solving the Problem

To this end, an aspect of the control device for a brushless motor according to the present invention includes a voltage control unit for increasing the input voltage of the brushless motor when the duration for which the induced voltage is maintained unchanged or the duration for which a currently selected one of the energization modes is maintained employed reaches a predetermined time. An aspect of the control method for a brushless motor according to the present invention includes the step of measuring the duration for which the induced voltage is maintained unchanged or the duration for which a currently selected one of the energization modes is maintained employed, and the step of increasing the input voltage of the brushless motor when the measured time reaches a predetermined time.

Effects of the Invention

According to the invention as described above, when the induced voltage is maintained unchanged and the current energization mode is maintained employed for the predetermined duration, the input voltage of the brushless motor is increased so as to reactivate the brushless motor. Thus, the present invention capable of preventing the brushless motor from staying in the stopped state, even if the brushless motor stops and the most recent measurement data before the motor stops is higher than the command value.

MODE FOR CARRYING OUT THE INVENTION

Figure 1:
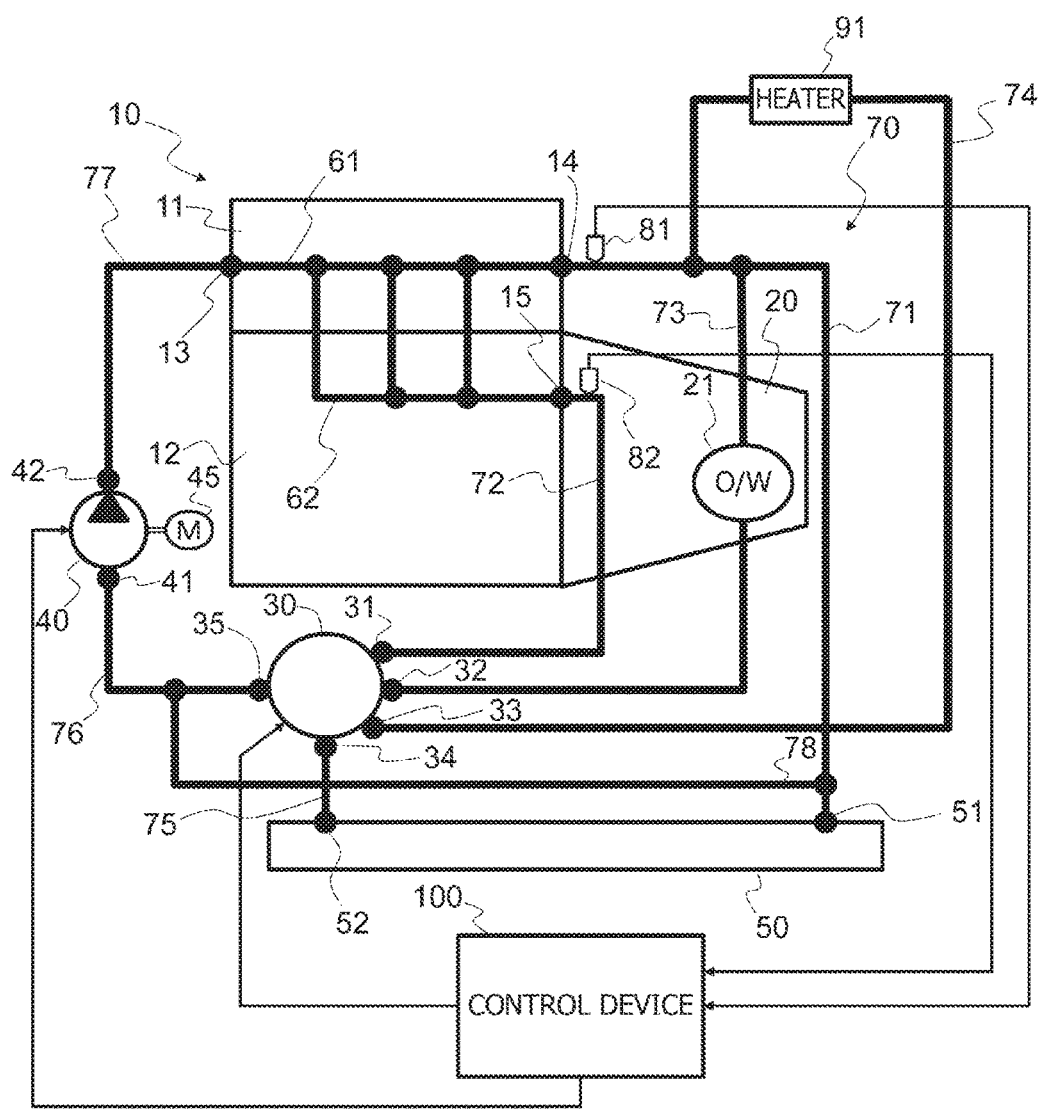
FIG. 1 illustrates a cooling system of an internal combustion engine according to an embodiment of the present invention.

An embodiment of the present invention will be described below. FIG. 1 illustrates a cooling system of an internal combustion engine for a vehicle as an example of a control device and a control method for a brushless motor according to the present invention. The cooling system includes an electric water pump actuated by a brushless motor.

A transmission 20 such as a continuously variable transmission (CVT), as an example of a powertrain, is coupled to the output shaft of an internal combustion engine 10. The output of transmission 20 is transmitted to the drive wheels of an unillustrated vehicle. Internal combustion engine 10 is cooled by a water-based cooling system which circulates cooling water through a circulation passage. The cooling system includes a flow rate control valve 30, an electric water pump 40 actuated by a brushless motor 45, a radiator 50, a cylinder head cooling water passage 61, a cylinder block cooling water passage 62, a heater core 91, an oil warmer/cooler 21 for transmission 20, pipes 70 connecting these components, and the like.

Cylinder head cooling water passage 61 for internal combustion engine 10 extends in cylinder head 11 so as to connect a cooling water inlet 13 and a cooling water outlet 14 which are provided to cylinder head 11. In cylinder head 11, cooling water inlet 13 is provided at one end in the cylinder arrangement direction, and cooling water outlet 14 is provided at the other end in the cylinder arrangement direction. Cylinder block cooling water passage 62 for internal combustion engine 10 branches off from cylinder head cooling water passage 61 and enters cylinder block 12. Cylinder block cooling water passage 62 extends in cylinder block 12 and is connected to a cooling water outlet 15 provided to cylinder block 12.

To cooling water outlet 14 of cylinder head 11, one end of a first cooling water pipe 71 is connected. The other end of first cooling water pipe 71 is connected to a cooling water inlet 51 of radiator 50. To cooling water outlet 15 of cylinder block cooling water passage 62, one end of a second cooling water pipe 72 is connected. The other end of second cooling water pipe 72 is connected to a first inlet port 31 among four inlet ports 31 to 34 of flow rate control valve 30.

One end of a third cooling water pipe 73 is connected to a certain point of first cooling water pipe 71. The other end of third cooling water pipe 73 is connected to second inlet port 32 of flow rate control valve 30. At a certain point of third cooling water pipe 73, oil warmer/cooler 21 is disposed for controlling the hydraulic oil temperature of transmission 20. One end of a fourth cooling water pipe 74 is connected to first cooling water pipe 71 at a point between cooling water outlet 14 and the junction with third cooling water pipe 73. The other end of fourth cooling water pipe 74 is connected to third inlet port 33 of flow rate control valve 30. Various heat exchanging devices, such as heater core 91 for heating air for air conditioning in the vehicle air conditioner, are disposed on fourth cooling water pipe 74.

One end of a fifth cooling water pipe 75 is connected to a cooling water outlet 52 of radiator 50. The other end of fifth cooling water pipe 75 is connected to fourth inlet port 34 of flow rate control valve 30. Flow rate control valve 30 has a single outlet port 35. One end of a sixth cooling water pipe 76 is connected to outlet port 35. The other end of sixth cooling water pipe 76 is connected to an intake port 41 of electric water pump 40.

One end of a seventh cooling water pipe 77 is connected to a discharge port 42 of electric water pump 40. The other end of seventh cooling water pipe 77 is connected to cooling water inlet 13 of cylinder head 11. One end of an eighth cooling water pipe 78 is connected to first cooling water pipe 71. The other end of eighth cooling water pipe 78 is connected to sixth cooling water pipe 76. Specifically, in first cooling water pipe 71, the point where eighth cooling water pipe 78 is connected is located downstream to the point connected to third cooling water pipe 73 and downstream to the point connected to fourth cooling water pipe 74.

As described above, flow rate control valve 30 has four inlet ports 31 to 34 and one outlet port 35. Cooling water pipes 72, 73, 74, 75 are connected to inlet ports 31, 32, 33, 34, respectively. Flow rate control valve 30 regulates the opening areas of cooling water pipes 72, 73, 74, 75, i.e., the opening areas of the outlets of the cooling water circulation lines so as to control the cooling water circulation rates through cooling water pipes 72, 73, 74, 75. Even when inlet ports 31 to 34 of flow rate control valve 30 are all closed, eighth cooling water pipe 78 allows the cooling water having passed through cylinder head cooling water passage 61 to circulate, bypassing radiator 50.

Electric water pump 40 and flow rate control valve 30 described above are controlled by a control device 100. Based on information such as the cooling water temperature in internal combustion engine 10 measured by water temperature sensors 81, 82, control device 100 controls the discharge flow rate of electric water pump 40 (i.e., the rotation speed of brushless motor 45) as well as the opening areas of inlet ports 31 to 34 of flow rate control valve 30. Note that the present invention is not limited to a configuration including two water temperature sensors. For example, among water temperature sensors 81, 82, water temperature sensor 82 may be omitted.

In situations such as at cold engine start, i.e., at engine start when the cooling water temperature of internal combustion engine 10 is below the cold engine determination threshold value, control device 100 controls flow rate control valve 30 so as to close all inlet ports 31 to 34 while controlling electric water pump 40 at an extremely low rotation speed (in the vicinity of 100 rpm to 200 rpm, for example). In other words, at cold start of internal combustion engine 10, the cooling water having entered cylinder head cooling water passage 61 circulates at a minimum flow rate, bypassing the other heat exchanging devices such as radiator 50. This accelerates the temperature rise in cylinder head 11 while reducing variation in cooling water temperature within the cooling water circulation route. After that, in accordance with the temperature rise of the cooling water in internal combustion engine 10, control device 100 stepwise opens inlet ports 31 to 34 while increasing the rotation speed of electric water pump 40 so as to maintain the cooling water temperature within an adequate range.

Figure 2:
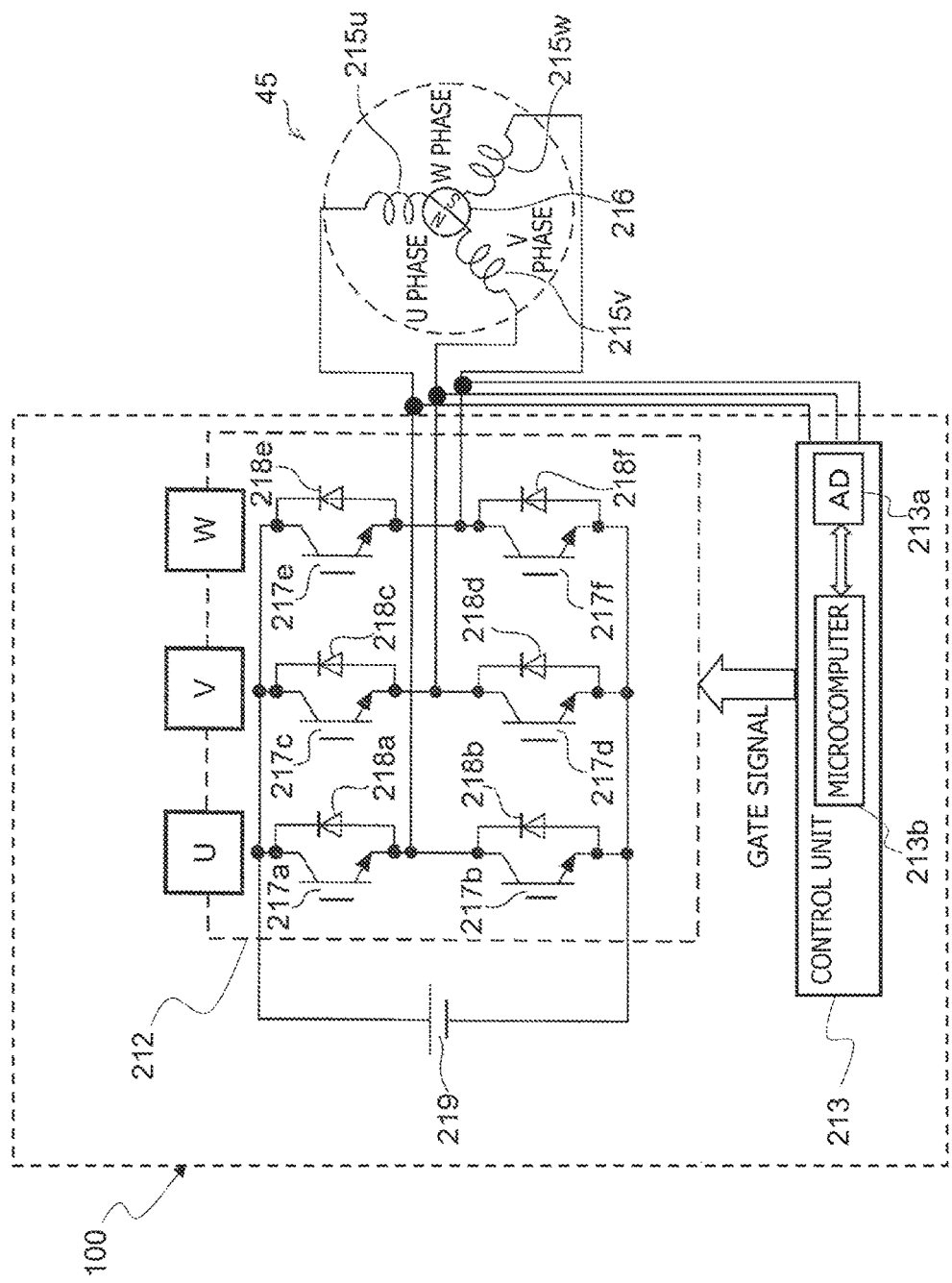
FIG. 2 is a circuit diagram of a configuration of the brushless motor and the motor control device according to an embodiment of the present invention.

FIG. 2 is a circuit diagram of an implementation of brushless motor 45 for actuating electric water pump 40 and a control unit for brushless motor 45 included in control device 100. Control device 100 for brushless motor 45 includes a motor driving circuit 212 and a control unit 213. Control unit 213 includes an A/D converter 213a and a microcomputer 213b. Microcomputer 213b includes a microprocessor (such as CPU or MPU), and the like.

Brushless motor 45 is a three-phase DC brushless motor including an unillustrated cylindrical stator, a permanent magnet rotor (rotor) 216, and star-connected three-phase coils, which are a U-phase coil 215u, a V-phase coil 215v, and a W-phase coil 215w. U-, V-, W-phase coils 215u, 215v, 215w are provided in the stator. Permanent magnet rotor 216 is rotatably disposed in a space defined in a center portion of the stator. Note that, although three-phase coils 215u, 215v, 215w in brushless motor 45 illustrated in FIG. 2 are star-connected, a brushless motor including delta-connected three-phase coils 215u, 215v, 215w may alternatively be employed. Motor driving circuit 212 has an inverter circuit 212a and a power supply circuit 219. Inverter circuit 212a includes three-phase bridge-connected switching elements 217a to 217f. Switching elements 217a to 217f respectively include antiparallel diodes 218a to 218f. Each of switching elements 217a to 217f is formed of a field effect transistor (FET), for example.

Control terminals (gate terminals) of switching elements 217a to 217f are connected to control unit 213. Control unit 213 controls a voltage (motor input voltage) applied to brushless motor 45 by controlling the on and off of switching elements 217a to 217f by triangle-wave comparison pulse width modulation (PWM). In the triangle-wave comparison PWM control, control unit 213 determines the time for turning on or off each of switching elements 217a to 217f by comparing between a triangle wave (carrier) and a PWM timer (PWM duty) set based on a command duty ratio (command pulse width).

The greater the command duty ratio, the greater value the PWM timer is set to. For example, the PWM timer is set to the maximum for 100% duty ratio, and set to the minimum (zero) for 0% duty ratio. Brushless motor 45 does not include any sensor for detecting rotor position information. Control unit 213 performs sensorless drive control on brushless motor 45 without using any sensor for detecting rotor position information. Specifically, control unit 213 switches between two sensorless drive methods, i.e., a sine-wave drive method and a square-wave drive method, in accordance with the motor rotation speed.

In the sine-wave drive method, control unit 213 drives brushless motor 45 by applying a sine-wave voltage to each phase. In this sine-wave drive method, control unit 213 detects rotor position information based on an induced voltage (speed electromotive voltage) generated by rotation of rotor 216. Furthermore, in the interval between detections of the rotor position based on the speed electromotive voltage, control unit 213 estimates the rotor position based on the motor rotation speed. Control unit 213 calculates a three-phase output value based on the estimated rotor position and the PWM duty, and causes a three-phase alternating current to flow through the phases by controlling the direction and magnitude of the current based on differences between phase-to-phase voltages. Control unit 213 calculates the motor rotation speed based on the detection frequency of the rotor position.

In the square-wave drive method, control unit 213 drives brushless motor 45 by sequentially switching between patterns (energization modes) for selecting two phases to which a pulse voltage is to be applied from the three phases, each time rotor 216 reaches one of the predetermined positions. In this square-wave drive method, control unit 213 applies a pulse-form voltage to these two phases selected to be energized, and acquires rotor position information by comparing a voltage (transformer electromotive voltage) in a non-energized phase (open-circuit phase) induced by this voltage application and its threshold value. Based on this position information, control unit 213 detects whether or not it is the time for switching between the energization modes, i.e., the patterns for selecting phases to be energized.

Here, as the motor rotation speed decreases, the output level of the speed electromotive voltage detected for rotor position detection in the sine-wave drive method decreases. Thus, the rotor position detection accuracy in the sine-wave drive method degrades in a low rotation speed range. On the other hand, the pulse induced voltage detected for rotor position detection in the square-wave drive method can be detected even in a low rotation speed range including the motor stopped state. Thus, the square-wave drive method allows maintaining rotor position detection accuracy even in a low rotation speed range. In light of the above, control unit 213 may control brushless motor 45 by the sine-wave drive method in a high rotation speed range within which rotor position information can be sufficiently accurately detected by this sine-wave drive method, i.e., in a motor rotation speed range above a preset rotation speed. On the other hand, control unit 213 may control brushless motor 45 by the square-wave drive method in a low rotation speed range within which rotor position information cannot be sufficiently accurately detected by the sine-wave drive method.

Here, the low rotation speed range within which rotor position information cannot be sufficiently accurately detected by the sine-wave drive method as described above includes a motor rotation speed range below the preset rotation speed and a rotation speed range at motor start. Furthermore, control unit 213 performs the PWM control on brushless motor 45 by determining the PWM control duty ratio in accordance with the difference between a detected motor rotation speed and a target motor rotation speed (command value of the rotation speed), and adjusting the actual motor rotation speed toward the target motor rotation speed.

Figure 3:
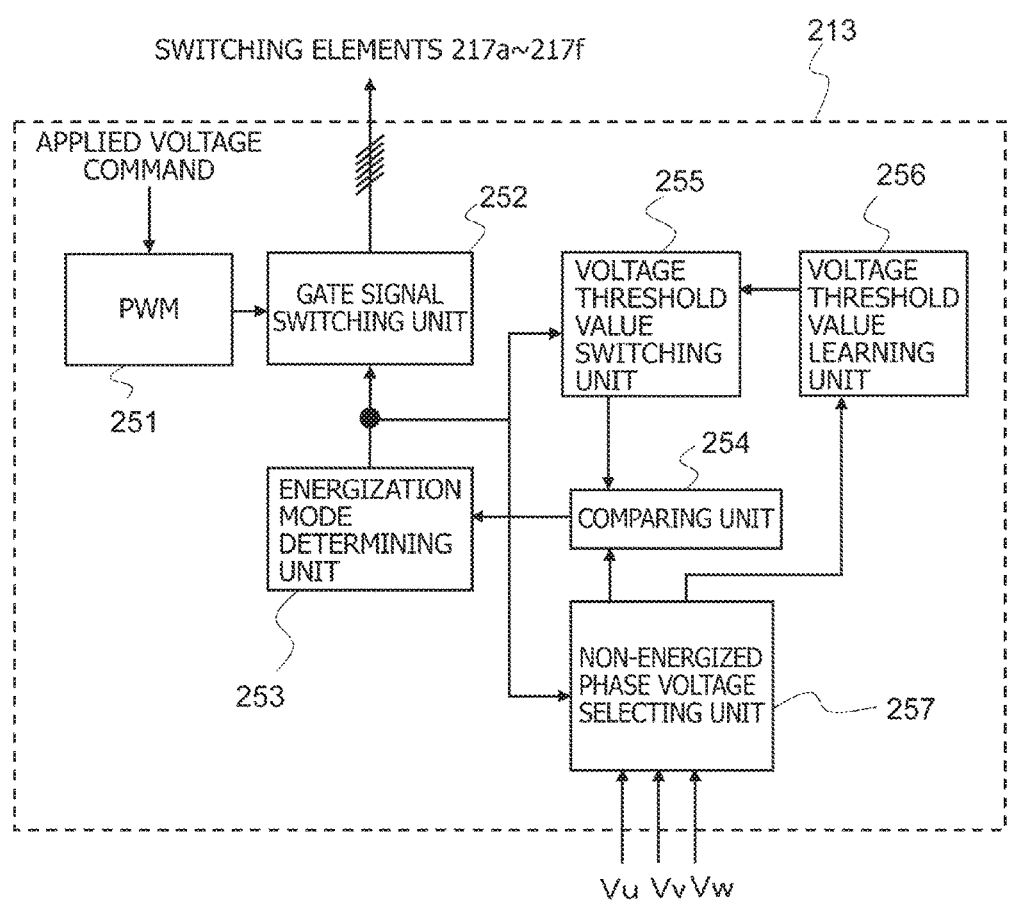
FIG. 3 is a functional block diagram of the control unit according to an embodiment of the present invention.

Below, an implementation of the control performed by control unit 213 for driving brushless motor 45 by the square wave drive method will be described in detail. FIG. 3 is a functional block diagram of control unit 213 which performs the sensorless control according to the square wave drive method. Control unit 213 includes a PWM generating unit 251, a gate signal switching unit 252, an energization mode determining unit 253, a comparing unit 254, a voltage threshold value switching unit 255, a voltage threshold value learning unit 256, and a non-energized phase voltage selecting unit 257.

Based on the applied voltage command (command voltage) depending on the difference between the command value and detected value of the rotation speed, PWM generating unit 251 generates a PWM wave having a pulse width modulated by the triangle-wave comparison method. Energization mode determining unit 253 outputs a mode command signal for specifying an energization mode in motor driving circuit 212. Triggered by a mode switching trigger signal output by comparing unit 254, energization mode determining unit 253 switches between six energization modes.

The energization modes are patterns for selecting two phases to which a pulse voltage is applied from among the three phases, i.e., the U, V, W phases in brushless motor 45, and include the first to sixth energization modes M1 to M6. In the first energization mode M1, a current is caused to flow sequentially through the U and V phases. In the second energization mode M2, a current is caused to flow sequentially through the U and W phases. In the third energization mode M3, a current is caused to flow sequentially through the V and W phases. In the fourth energization mode M4, a current is caused to flow sequentially through the V and U phases. In the fifth energization mode M5, a current is caused to flow sequentially through the W and U phases. In the sixth energization mode M6, a current is caused to flow sequentially through the W and V phases. In response to the mode switching trigger signal output by comparing unit 254, energization mode determining unit 253 generates the mode command signal for directing any one of the first to sixth energization modes M1 to M6.

Based on the mode command signal output by energization mode determining unit 253, gate signal switching unit 252 determines the operational states to which switching elements 217a to 217f in motor driving circuit 212 are switched. According to the determination, gate signal switching unit 252 outputs six gate pulse signals to motor driving circuit 212. Voltage threshold value switching unit 255 performs control for detecting whether the time for energization mode switching has come based on a voltage induced in a non-energized phase. In this control, voltage threshold value switching unit 255 sequentially switches between threshold values to be compared with such an induced voltage which are previously set respectively for the energization modes, and outputs one of the threshold values in accordance with the next energization mode. The time for switching between the threshold values is determined based on the mode command signal output by energization mode determining unit 253.

Non-energized phase voltage selecting unit 257 is a circuit for selecting, based on the mode command signal, a detected voltage in a non-energized phase from among the detected three-phase terminal voltages Vu, Vv, Vw of brushless motor 45, and for outputting this non-energized phase terminal voltage to comparing unit 254 and voltage threshold value learning unit 256. Strictly speaking, the non-energized phase terminal voltage is a voltage between the ground GND and the non-energized phase terminal. However, in this embodiment, a voltage at a neutral point is measured, then this voltage at the neutral point is subtracted from the voltage between the ground GND and the terminal 112u, 112v, 112w, and the difference thus obtained is used as the terminal voltage Vu, Vv, Vw.

By comparing the threshold value output by voltage threshold value switching unit 255 with the voltage value detected in a non-energized phase (detected induced voltage value) output by non-energized phase voltage selecting unit 257, comparing unit 254 detects whether or not the time for energization mode switching has come, in other words, whether or not the magnetic pole of rotor 216 has reached a predetermined position (magnetic pole position). When detecting that the time for switching has come, comparing unit 254 outputs a mode switching trigger signal to energization mode determining unit 253. Voltage threshold value learning unit 256 is a functional unit that updates the threshold values for determining whether or not the time for energization mode switching has come, and stores the updated threshold values.

Here, the pulse induced voltage in a non-energized phase varies due to manufacturing variations of brushless motor 45 or detection variations of the voltage detecting circuit. Thus, if each threshold value is a fixed value, the time for energization mode switching might be erroneously determined to have come. To avoid this, voltage threshold value learning unit 256 performs threshold value learning processing. Specifically, in the threshold value learning processing, voltage threshold value learning unit 256 first detects the induced voltage at the predetermined magnetic pole position corresponding to each time for energization mode switching. Then, voltage threshold value learning unit 256 corrects the corresponding voltage threshold value stored in voltage threshold value switching unit 255 based on the detection result.

As described above, the number of the energization modes is six, which are the energization modes M1 to M6. By sequentially switching between these energization modes M1 to M6 at the switching angular positions which are spaced an electric angle of 60 degrees apart, and thereby sequentially switching, among the three phases of brushless motor 45, two phases to which a pulse voltage (pulse-form voltage) is to be applied, control unit 213 rotates brushless motor 45.

For example, control unit 213 switches between the energization modes M1 to M6 as follows, where the reference angular position (angle=0 degrees) of rotor 216 (magnetic pole) is the angular position of the U-phase coil. When the rotor angular position (magnetic pole position) is at 30 degrees, control unit 213 switches from the third energization mode M3 to the fourth energization mode M4. When the rotor angular position is at 90 degrees, control unit 213 switches from the fourth energization mode M4 to fifth energization mode M5. When the rotor angular position is at 150 degrees, control unit 213 switches from the fifth energization mode M5 to the sixth energization mode M6. When the rotor angular position is at 210 degrees, control unit 213 switches from the sixth energization mode M6 to the first energization mode M1. When the rotor angular position is at 270 degrees, control unit 213 switches from the first energization mode M1 to the second energization mode M2. When the rotor angular position is at 330 degrees, control unit 213 switches from the second energization mode M2 to the third energization mode M3.

Voltage threshold value switching unit 255 in control unit 213 stores therein, as updatable threshold values, the non-energized phase induced voltages (transformer electromotive forces) at the rotor angular positions each corresponding to the time for energization mode switching. Voltage threshold value switching unit 255 outputs one of these threshold values in accordance with the next energization mode. When the voltage induced in a non-energized phase reaches the thus-output threshold value, comparing unit 254 outputs a signal indicating detection of an angle corresponding to the next time for energization mode switching. Based on the signal, energization mode determining unit 253 switches from the current energization mode to the next mode.

For example, in the first energization mode M1 for causing a current to flow sequentially through the U and V phases, control unit 213 (gate signal switching unit 252) variably controls the average value of voltages applied to the U and V phases, which are energized in accordance with the PWM duty. Specifically, control unit 213 (gate signal switching unit 252) controls the on/off ratio of V-phase lower switching element 217d (V-phase lower arm) by the PWM method while turning on U-phase upper switching element 217a (U-phase upper arm). In the first energization mode M1, for example, control unit 213 (gate signal switching unit 252) may turn off remaining switching elements 217 other than U-phase upper switching element 217a and V-phase lower switching element 217d. Alternatively, control unit 213 (gate signal switching unit 252) may control inverter circuit 212a by a complementary PWM method, and drive the upper and lower arms in each energized phase individually based on PWM waves having mutually opposite phases.

[Processing for Increasing Voltage]

Figure 4:
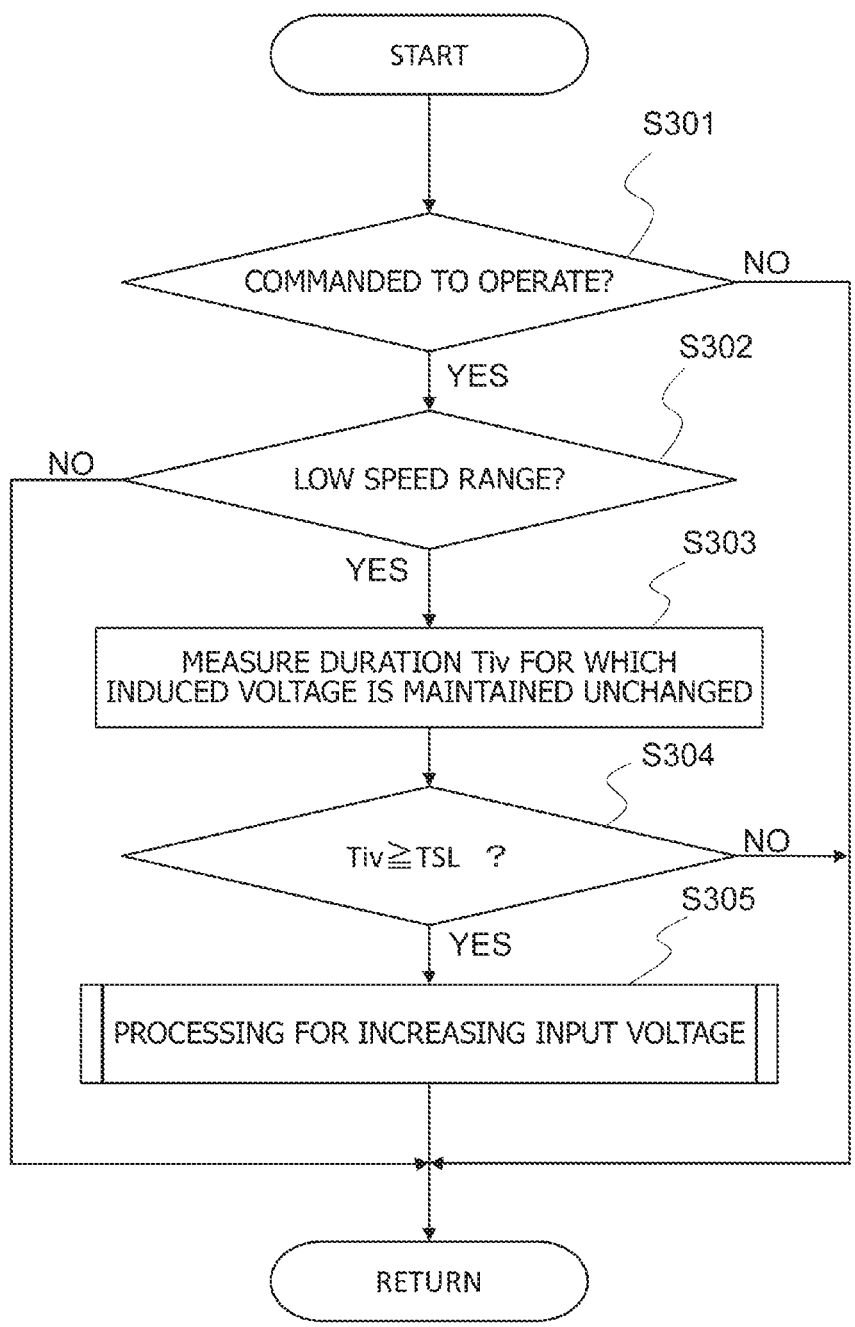
FIG. 4 is a flowchart illustrating the procedure for the processing for increasing the applied voltage according to an embodiment of the present invention.

Next, with reference to the flowchart of FIG. 4, description will be given of processing (software-based function to serve as a voltage control unit) performed by control unit 213 in response to an abrupt increase in the load on brushless motor 45 while control unit 213 performs the sensorless control on brushless motor 45 by the square wave drive method. First, in step S301, control unit 213 determines whether brushless motor 45 is commanded to rotate or stop.

When brushless motor 45 is commanded to stop, this routine ends immediately. Thereby, control unit 213 maintains the stopped state of brushless motor 45 without interruption. When brushless motor 45 is commanded to rotate, the operation proceeds to step S302. In step S302, control unit 213 determines whether or not brushless motor 45 is driven under the PWM control according to the square wave drive method; in other words, whether or not the command value of the rotation speed of brushless motor 45 is within the low rotation speed range defined for employing the square wave drive method.

When control unit 213 determines that brushless motor 45 is driven under the PWM control according to the sine wave drive method; in other words, determines that the command value of the rotation speed of brushless motor 45 is within the high rotation speed range defined for employing the sine wave drive method, this routine ends immediately. Thereby, control unit 213 continues the control for driving brushless motor 45 by the sine wave drive method.

On the other hand, when control unit 213 determines that brushless motor 45 is driven under the PWM control according to the square wave drive method; in other words, determines that the command value of the rotation speed of brushless motor 45 is within the low rotation speed range defined for employing the square wave drive method, the operation proceeds to step S303. In step S303, control unit 213 measures the duration for which the voltage induced in a non-energized phase is maintained unchanged, or the duration for which the current energization mode is maintained employed.

The voltage induced in a non-energized phase is sampled at predetermined time intervals. Accordingly, the "duration for which the voltage induced in a non-energized phase is maintained unchanged" above indicates the duration for which the difference between two sequentially sampled values of the voltage induced in a non-energized phase is maintained less than or equal to a predetermined value. The "duration for which the current energization mode is maintained employed" above indicates time elapsed from the last energization mode switching. Here, when, for example, the pumping unit of electric water pump 40 impacts foreign matter, the load on electric water pump 40 abruptly increases, thus reducing the rotation speed of brushless motor 45. If such a situation arises while brushless motor 45 is driven under the PWM control according to the square wave drive method, control for increasing the applied voltage (input voltage) might not be performed in a timely manner in response to this rotation speed reduction of brushless motor 45 (because of a response delay in rotation feedback control), and brushless motor 45 might stop.

When brushless motor 45 stops, the time for energization mode switching, which corresponds to the time for updating the measurement value of the rotation speed is no longer detected. As a result, the measurement value of the rotation speed is maintained unchanged since the last update before the stop of brushless motor 45. In this case, when the measurement value of the rotation speed is higher than the command value of the rotation speed, control unit 213 reduces the applied voltage (rotation torque) of brushless motor 45 in the rotation speed feedback control, trying to reduce the rotation speed of brushless motor 45 according to this measurement value, which is actually no longer updated. As a result, brushless motor 45, which has been stopped by the abrupt load increase, stays in the stopped state.

In other words, when the load on electric water pump 40 increases as a result, for example, of the pumping unit's impacting foreign matter, the rotation torque for brushless motor 45 needs to increase in order to achieve the rotation speed command value, but actually control unit 213 reduces the rotation torque, thus causing brushless motor 45 to stay in the stopped state. When brushless motor 45 stays in the stopped state, the voltage induced in a non-energized phase is maintained unchanged, which makes it impossible to detect that the time for energization mode switching has come, so that energization mode switching is suspended.

In order to determine whether or not brushless motor 45 stays in the stopped state due to an abrupt load increase as described above, control unit 213 measures the duration for which the voltage induced in a non-energized phase is maintained unchanged or the duration for which the current energization mode is maintained employed in step S303. Then, the operation proceeds to step S304. In step S304, control unit 213 determines whether the duration measured in step S303 has reached a predetermined time length (threshold value) TSL.

The predetermined time length TSL is set in advance to a value that allows control unit 213 to detect that brushless motor 45 stays in the stopped state as soon as possible based on the duration for which the voltage induced in a non-energized phase is maintained unchanged or the duration for which the current energization mode is maintained employed. When the duration measured in step S303 does not reach the predetermined time length TSL, control unit 213 determines that brushless motor 45 does not stay in the stopped state, and this routine ends immediately. Thereby, control unit 213 continues the PWM control according to the square wave drive method and determines a voltage to be applied to brushless motor 45 in accordance with the difference between the measurement and command values of the rotation speed of brushless motor 45.

On the other hand, when the duration measured in step S303 has reached the predetermined time length TSL, control unit 213 determines that brushless motor 45 stays in the stopped state, and the operation proceeds to step S305. In step S305, control unit 213 increases the applied voltage (input voltage) of brushless motor 45 by performing processing for determining a voltage to be applied to brushless motor 45 modified from the processing based on the difference between the measurement and command values of the rotation speed of brushless motor 45.

In other words, while the updating of the measurement value of the rotation speed of brushless motor 45 is disabled, if control unit 213 determines a voltage to be applied to brushless motor 45 through the normal determination processing based on the difference (control difference) between the measurement and command values of the rotation speed of brushless motor 45, control unit 213 fails to reactivate brushless motor 45 which is currently in the stopped state. Accordingly, in order to reactivate brushless motor 45 which is currently in the stopped state due to an abrupt load increase, control unit 213 increases the applied voltage (input voltage) of brushless motor 45 (compared to the applied voltage expected to be determined in this normal determination processing) by performing processing modified from the normal determination processing.

[Increasing Correction of Command Value of Rotation Speed]

Figure 5:
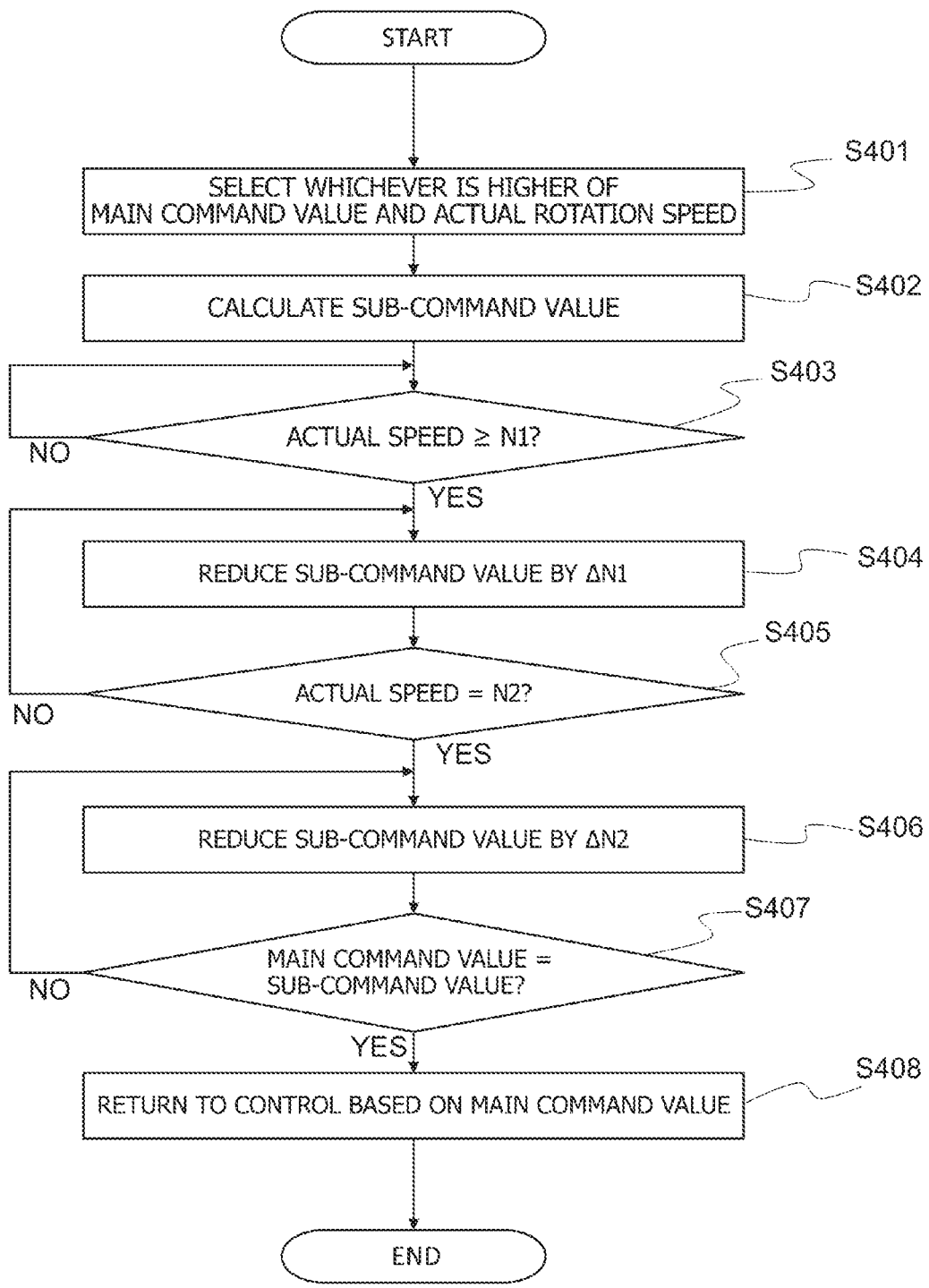
FIG. 5 is a flowchart illustrating the procedure for the processing for increasing the applied voltage through increasing correction of the command value of the rotation speed according to an embodiment of the present invention.

As the processing for increasing the applied voltage in step S305, control unit 213 may temporarily correct and increase the command value of the rotation speed (target rotation speed) for use in the rotation speed feedback control. The flowchart in FIG. 5 illustrates an implementation of the increasing correction processing of the command value of the rotation speed, which is performed as the processing for increasing the applied voltage in step S305.

In step S401, control unit 213 selects, as a base rotation speed NB, whichever is the higher of the command value of the rotation speed and the measurement value of the rotation speed that is maintained unchanged since the last update before the rotation stop of brushless motor 45. Then, the operation proceeds to step S402, in which control unit 213 sets the sum of the base rotation speed NB selected in step S401 and a predetermined corrective addition NHOS as a sub-command value for temporary use to increase the applied voltage and reactivate brushless motor 45.

Then, control unit 213 shifts from the processing for setting the applied voltage based on the command value (main command value) of the rotation speed, which is specified depending on the cooling water temperature and the like to the processing for setting the applied voltage based on the difference between the sub-command value (sub-command value=NB+NHOS) and the measurement value of the rotation speed. Note that, when the sub-command value becomes equal to the main command value as a result of the processing for gradually reducing the sub-command value, which will be described later, this rotation speed feedback control based on the sub-command value is cancelled and control unit 213 shifts back to the processing for setting the applied voltage based on the command value (main command value) of the rotation speed, which is specified depending on the cooling water temperature and the like.

For example, when brushless motor 45 is stopped due to an abrupt load increase while the measurement value of the rotation speed is above its command value (main command value), so that the measurement value of the rotation speed is maintained unchanged at this value, which is above the command value, after its updating is disabled, control unit 213 selects the measurement value of the rotation speed as the base rotation speed NB. Since control unit 213 sets the sub-command value to a value higher than the base rotation speed NB, the sub-command value is higher than the measurement value that is no longer updated. Thus, in the rotation speed feedback control using the sub-command value, control unit 213 increases the applied voltage in order to increase the measurement value toward the sub-command value (in other words, to increase the motor rotation speed).

This allows control unit 213 to generate a rotation torque high enough to overcome the abruptly increased load and successfully reactivate brushless motor 45 (to successfully remove the foreign matter from electric water pump 40), and prevents electric water pump 40 from staying in the stopped state. Thus, even when the load on electric water pump 40 abruptly increases and electric water pump 40 stops due, for example, to foreign matter trapped in electric water pump 40 while control unit 213 controls electric water pump 40 at an extremely low rotation speed, control unit 213 can quickly reactivate electric water pump 40 so as to continue the cooling water circulation.

When electric water pump 40 is prevented from staying in the stopped state, no cooling water stagnation occurs and no heat spots are made in the cooling system. Accordingly, control unit 213 can accurately sense the progression of the warm-up of internal combustion engine 10 based on the measurement values of water temperature sensors 81, 82, and appropriately control which route the cooling water should flow as well as the discharge rate of electric water pump 40. Thus, control unit 213 can prevent or mitigate deterioration in operation of internal combustion engine 10 when foreign matter is trapped in electric water pump 40. Here, in the above embodiment, control unit 213 selects, as the base rotation speed NB, whichever is the higher of the measurement and command values of the rotation speed, and sets the sub-command value to a value higher than the base rotation speed NB by the predetermined rotation speed difference. As an alternative, control unit 213 may set the sub-command value to a value higher than the main command value by a predetermined rotation speed difference. However, setting the sub-command value in a manner as described in the above embodiment ensures that control unit 213 reliably sets the sub-command value to a value that is higher, but not excessively higher, than the measurement value.

After control unit 213 performs the increasing correction processing of the command value of the rotation speed for use in the rotation speed feedback control in step S402, the operation proceeds to step S403. In step S403, control unit 213 determines whether or not the rotation speed of brushless motor 45 after reactivation has increased to a first rotation speed N1. The first rotation speed N1 is set less than the sub-command value but higher than the main command value. Control unit 213 repeats the determination in step S403 and maintains the sub-command value at its initial value until the rotation speed of brushless motor 45 reaches the first rotation speed N1. When the rotation speed of brushless motor 45 reaches the first rotation speed N1, the operation proceeds to step S404.

In step S404, control unit 213 performs processing for resetting the sub-command value to a rotation speed value which is obtained by subtracting a first corrective reduction $\Delta N1$ from the rotation speed value previously set as the sub-command value so as to gradually reduce the sub-command value. This allows the gradually decreasing sub-command value to be used in the rotation speed feedback control. In the next step S405, control unit 213 determines whether or not the gradually decreasing sub-command value has decreased to a second rotation speed N2. The first rotation speed N2 is set less than the first rotation speed N1 but higher than the main command value.

When the sub-command value is higher than the second rotation speed N2, the operation returns to step S404. Control unit 213 repeats the processing for reducing the sub-command value by the first corrective reduction $\Delta N1$ in step S404 at predetermined time intervals until the sub-command value decreases to the second rotation speed N2. When control unit 213 determines that the sub-command value has decreased to the second rotation speed N2 in step S405, the operation proceeds to step S406. In step S406, control unit 213 performs processing for resetting the sub-command value to a rotation speed value which is obtained by subtracting a second corrective reduction $\Delta N2$ from the rotation speed value previously set as the sub-command value so as to gradually reduce the sub-command value.

Here, the absolute value of the second corrective reduction $\Delta N2$ is set smaller than that of the first corrective reduction $\Delta N1$. This lowers the rate of reduction of the sub-command value after the sub-command value reaches the second rotation speed N2 as compared to before the sub-command value reaches the second rotation speed N2. After control unit 213 changes the rate of reduction of the sub-command value, the operation proceeds to step S407. In step S407, control unit 213 determines whether or not the sub-command value has decreased to the main command value. When the sub-command value is higher than the main command value, the operation returns to step S406. In this way, control unit 213 repeats the processing for reducing the sub-command value by the second corrective reduction ΔN2 in step S406 at predetermined time intervals while the sub-command value is higher than the main command value.

In other words, control unit 213 gradually reduces the sub-command value to the main command value, and, at a point during this reduction process, changes the rate of such reduction of the sub-command value to a lower rate. When the sub-command value has decreased to the main command value, the operation proceeds to step S408. In step S408, control unit 213 cancels the control based on the sub-command value and returns to the control based on the main command value.

The above control provides the following advantages. The control for increasing the motor rotation speed toward the initial sub-command value compensates for the risk of failing to start the rotation of brushless motor 45. In addition, gradually reducing the sub-command value after the rotation speed of brushless motor 45 has increased to the first rotation speed N1 (the main command value <N1< the initial sub-command value) prevents an excessive increase in the rotation speed of brushless motor 45.

Furthermore, while the sub-command value is gradually reduced to the main command value, the rate of reduction of the sub-command value is set relatively high immediately after the start of this gradual reduction, and then changed to a lower rate when the sub-command value comes closer to the main command value. This prevents an excessive increase in the rotation speed of brushless motor 45 as well as unstable rotation of brushless motor 45 due to an abrupt decrease in its rotation torque, which is expected if the command value is rapidly reduced with foreign matter trapped in electric water pump 40. In the processing illustrated in the flowchart of FIG. 5, control unit 213 stepwise lowers the rate of reduction by switching the rate of reduction of the sub-command value to a lower rate only once. However, control unit 213 may perform such switching of the rate of reduction more than once.

Figure 6:
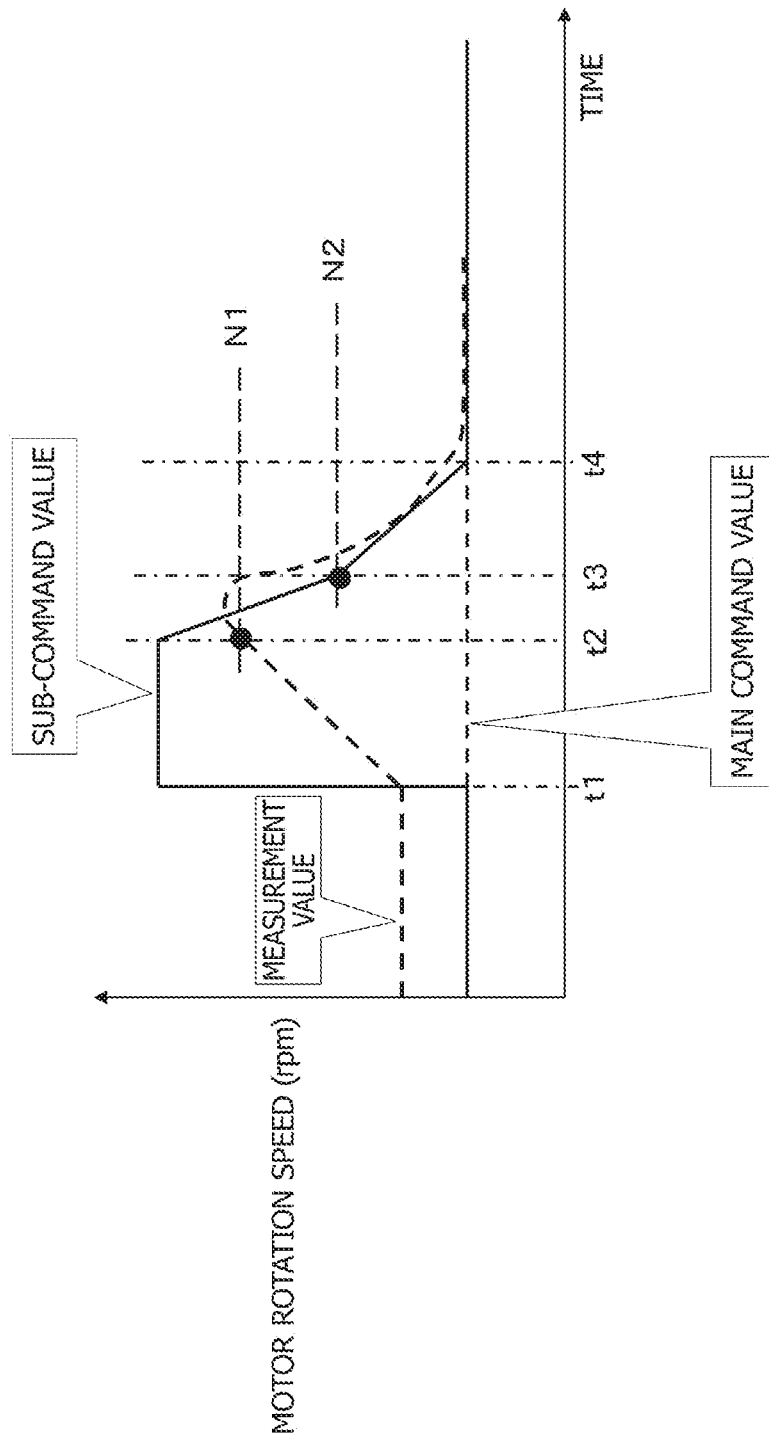
FIG. 6 is a time chart exemplifying how the command value of the rotation speed is changed by the increasing correction of the command value of the rotation speed according to an embodiment of the present invention.

The time chart of FIG. 6 exemplifies how the command value of the rotation speed is changed by the processing illustrated in the flowchart of FIG. 5. At time point t1, the duration for which the voltage induced in a non-energized phase is maintained unchanged or the duration for which the current energization mode is maintained employed reaches the predetermined time length TSL. In response, control unit 213 performs the processing for stepwise increasing the command value of the rotation speed from the main command value.

As a result, brushless motor 45 is reactivated and the updating of the measurement value of the rotation speed resumes. Then, at time point t2, the measurement value of the rotation speed increases to N1. In response, control unit 213 starts the processing for reducing the corrective addition for the command value of the rotation speed and gradually reduces the command value (sub-command value). Then, at time point t3, the command value of the rotation speed decreases to N2. In response, control unit 213 changes the rate of reduction of the command value to a lower rate than before. As a result, at time point t4, the command value of the rotation speed has decreased to the main command value. In response, control unit 213 returns to the normal control based on the main command value.

[Reducing Correction of Measurement Value of Rotation Speed]

As an alternative of the processing for increasing the applied voltage in step S305, control unit 213 may correct and reduce the measurement value of the rotation speed for use in the rotation speed feedback control. The flowchart in FIG. 7 illustrates an implementation of the reducing correction processing of the measurement value of the rotation speed, which is performed as the processing for increasing the applied voltage in step S305.

Figure 7:
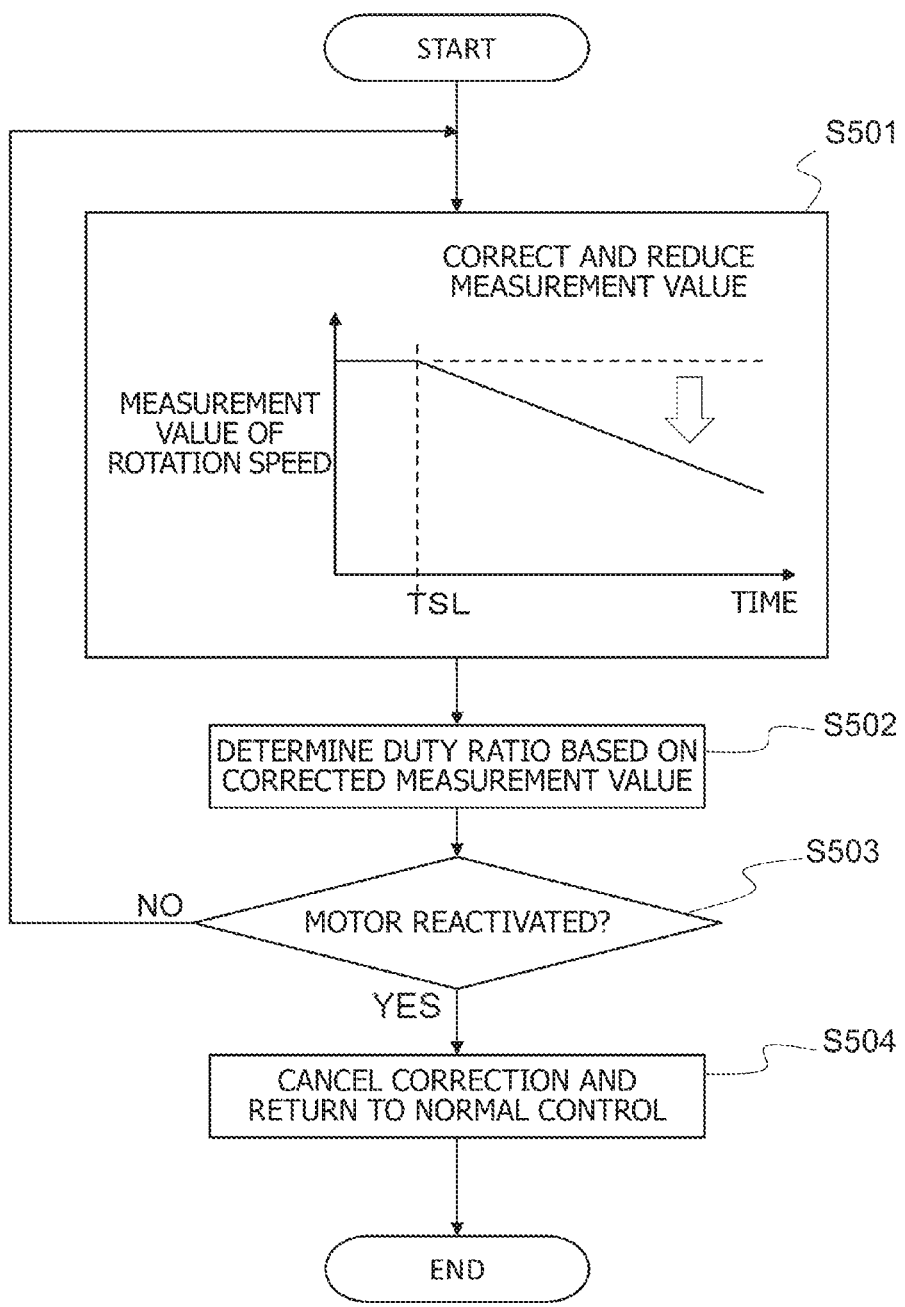
FIG. 7 is a flowchart illustrating the procedure for the processing for increasing the applied voltage through reducing correction of the measurement value of the rotation speed according to an embodiment of the present invention.

In the flowchart of FIG. 7, control unit 213 corrects and reduces the measurement value of the rotation speed in step S501. Specifically, control unit 213 corrects the measurement value of the rotation speed such that the longer the time elapsed from when the duration for which the voltage induced in a non-energized phase is maintained unchanged or the duration for which the current energization mode is maintained employed reaches the predetermined time length TSL, the less the measurement value of the rotation speed, i.e., the greater the corrective reduction for the measurement value of the rotation speed. Then, in the next step S502, control unit 213 determines the PWM control duty ratio based on comparison of the corrected measurement value with the command value of the rotation speed.

Furthermore, in step S503, control unit 213 determines whether or not the voltage induced in a non-energized phase no longer stays unchanged and the energization mode switching is possible, i.e., whether or not brushless motor 45 has been reactivated. When control unit 213 determines that brushless motor 45 has been reactivated, the operation proceeds to step S504. In step S504, control unit 213 cancels the reducing correction processing of the measurement value of the rotation speed (or gradually reduces the corrective reduction), and returns to the normal control using the non-corrected measurement value of the rotation speed.

The above configuration provides the following advantages. When the rotation speed feedback control is not performed in a timely manner in response to an abrupt increase in load on brushless motor 45, this might stop brushless motor 45. As a result, the updating of the measurement value of the rotation speed also stops and the measurement value of the rotation speed is maintained unchanged at a value higher than the command value. In such a case, control unit 213 becomes unable to detect position information of brushless motor 45, but nevertheless the above configuration allows control unit 213 to forcefully and gradually lower the measurement value of the rotation speed for use in the rotation speed feedback control (PWM control). Consequently, over time, the measurement value of the rotation speed for use in the rotation speed feedback control is reduced from a value higher than the command value to a value less than the command value. When the measurement value of the rotation speed is reduced to less than the command value, this causes control unit 213 to increase the measurement value of the rotation speed to the command value by performing the rotation speed feedback control, thus enabling the reactivation of brushless motor 45.

Thus, even when brushless motor 45 stops with the measurement value of the rotation speed maintained unchanged at a value higher than the command value, the above configuration allows control unit 213 to reactivate brushless motor 45 and prevent electric water pump 40 from staying in the stopped state.

[Increasing Correction of Command Value of Applied Voltage]

As another alternative of the processing for increasing the applied voltage in step S305, control unit 213 may correct and increase the command value of the applied voltage (command value of input voltage) determined through the rotation speed feedback control. The flowchart in FIG. 8 illustrates an implementation of the increasing correction processing of the command value of the applied voltage, which is performed as the processing for increasing the applied voltage in step S305.

Figure 8:
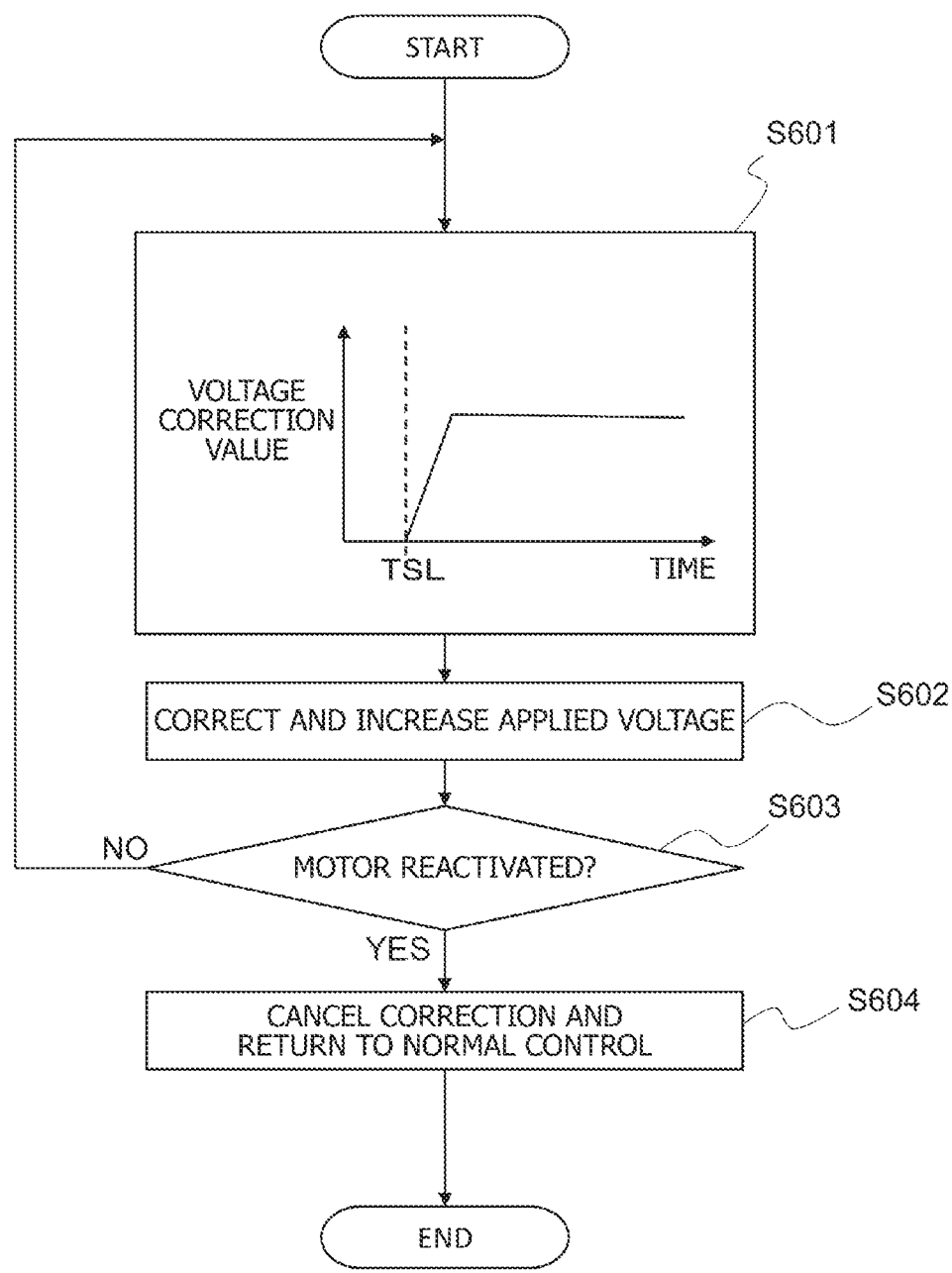
FIG. 8 is a flowchart illustrating the procedure for the processing for increasing the applied voltage through increasing correction of the command value of the applied voltage according to an embodiment of the present invention.

In the flowchart of FIG. 8, control unit 213 sets a voltage correction value (voltage correction value >0) for correcting and increasing the command value of the applied voltage in step S601. Specifically, control unit 213 varies the voltage correction value such that the longer the time elapsed from when the duration for which the voltage induced in a non-energized phase is maintained unchanged or the duration for which the current energization mode is maintained employed reaches the predetermined time length TSL, the greater the voltage correction value. Note, however, that an upper limit is previously set for the correction value for the command value of the applied voltage. Accordingly, the voltage correction value is fixed at the upper limit after the voltage correction value increases to the upper limit over time.

Then, the operation proceeds to step S602. In step S602, control unit 213 corrects and increases the command value of the applied voltage by adding the voltage correction value that is set in step S601 to the command value of the applied voltage that is calculated based on the difference between the measurement and command values of the rotation speed of brushless motor 45. In addition, control unit 213 determines the command duty ratio based on the corrected command value of the applied voltage. This increasing correction of the command value of the applied voltage allows increasing the applied voltage (input voltage) of brushless motor 45 and enables reactivation of brushless motor 45 even when the measurement and command values of the rotation speed is maintained unchanged (in other words, the control difference is maintained unchanged).

In the next step S603, control unit 213 determines whether or not the voltage induced in a non-energized phase no longer stays unchanged and detection of the time for energization mode switching is possible, i.e., whether or not brushless motor 45 has been reactivated from the stopped state. When control unit 213 determines that brushless motor 45 has been reactivated, so that the voltage induced in a non-energized phase no longer stays unchanged and the energization mode switching is possible, the operation proceeds to step S604. In step S604, control unit 213 cancels the increasing correction processing of the command value of the applied voltage (or gradually reduces the corrective addition for the command value of the applied voltage), and returns to the normal control for determining the command duty ratio using the non-corrected command value of the applied voltage that is determined through the rotation speed feedback control.

[Increasing Correction of Lower Limit for Command Value of Rotation Speed]

Here, even, for example, with a foreign matter trapped in electric water pump 40, control unit 213 can reactivate brushless motor 45 by performing the processing for increasing the applied voltage in step S305. However, in such a case, brushless motor 45 is likely to stop again upon cancellation of the processing for increasing the applied voltage. Thus, without removing foreign matter, the stop of brushless motor 45 and the reactivation of brushless motor 45 that is enabled by the processing for increasing the applied voltage are likely to be alternately repeated. Therefore, as processing for preventing or reducing such repetition of the stop and reactivation of brushless motor 45, control unit 213 may perform processing as illustrated in FIG. 9, i.e., the increasing correction processing of the lower limit for the command value of the rotation speed (i.e., increasing correction processing of the command value of the rotation speed for preventing or reducing such repetition).

Figure 9:
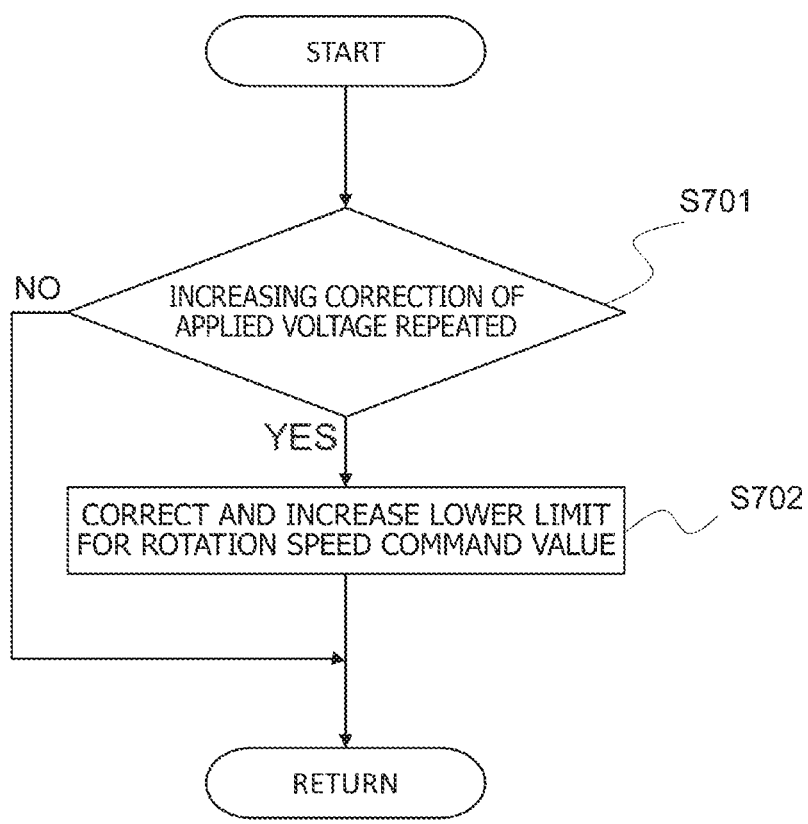
FIG. 9 is a flowchart illustrating the procedure for the processing for preventing or reducing the repetition of the stop and reactivation of the brushless motor according to an embodiment of the present invention.

In step S701 of the flowchart of FIG. 9, control unit 213 determines whether or not the stop of brushless motor 45 and the reactivation of brushless motor 45 that is enabled by the processing for increasing the applied voltage are alternately repeated. For example, control unit 213 may increment the repeat count by one when it performs the processing for increasing the applied voltage in step S305 again within a predetermined time from the last cancellation of this processing. On the other hand, control unit 213 may reset the repeat count to zero when determining that it does not perform the processing for increasing the applied voltage in step S305 again within the predetermined time from the last cancellation of this processing.

When the repeat count reaches a predetermined value (predetermined value >2), control unit 213 determines that the stop of brushless motor 45 and the reactivation of brushless motor 45 that is enabled by the processing for increasing the applied voltage are alternately repeated. When control unit 213 determines that the stop and reactivation of brushless motor 45 are repeated at a frequency equal to or greater than predetermined, the operation proceeds to step S702. In step S702, control unit 213 corrects and increases the lower limit for the command value of the rotation speed to a speed value higher than its initial value (base value). In other words, control unit 213 sets, to a value for during such repetition which is higher than the main command value, the command value of the rotation speed for use in the control after the cancellation of the processing for increasing the applied voltage in step S305.

Here, control unit 213 may increase the lower limit (command value for during such repetition) as the repeat count increases. When the command value (main command value) of the rotation speed calculated based on the cooling water temperature and the like is below the lower limit, control unit 213 selects, as the command value for use in the rotation speed feedback control, the lower limit value in place of the command value of the rotation speed calculated based on the cooling water temperature and the like.

As described above, when the repetition of the stop and reactivation of brushless motor 45 is observed, control unit 213 increases the lower limit for the command value of the rotation speed so as to rotate brushless motor 45 at a higher speed. This prevents brushless motor 45 from stopping because of a response delay in the rotation speed feedback control upon an abrupt increase in load on brushless motor 45. As a result, such repetition of stop and reactivation is prevented or reduced. After stepwise increasing the lower limit, control unit 213 gradually reduces the lower limit at a rate lower than that in increasing the lower limit (stepwise reduces the lower limit by a decrement having an absolute value smaller than the increment). This prevents the command value of the rotation speed from being maintained at an excessively high value.

Figure 10:
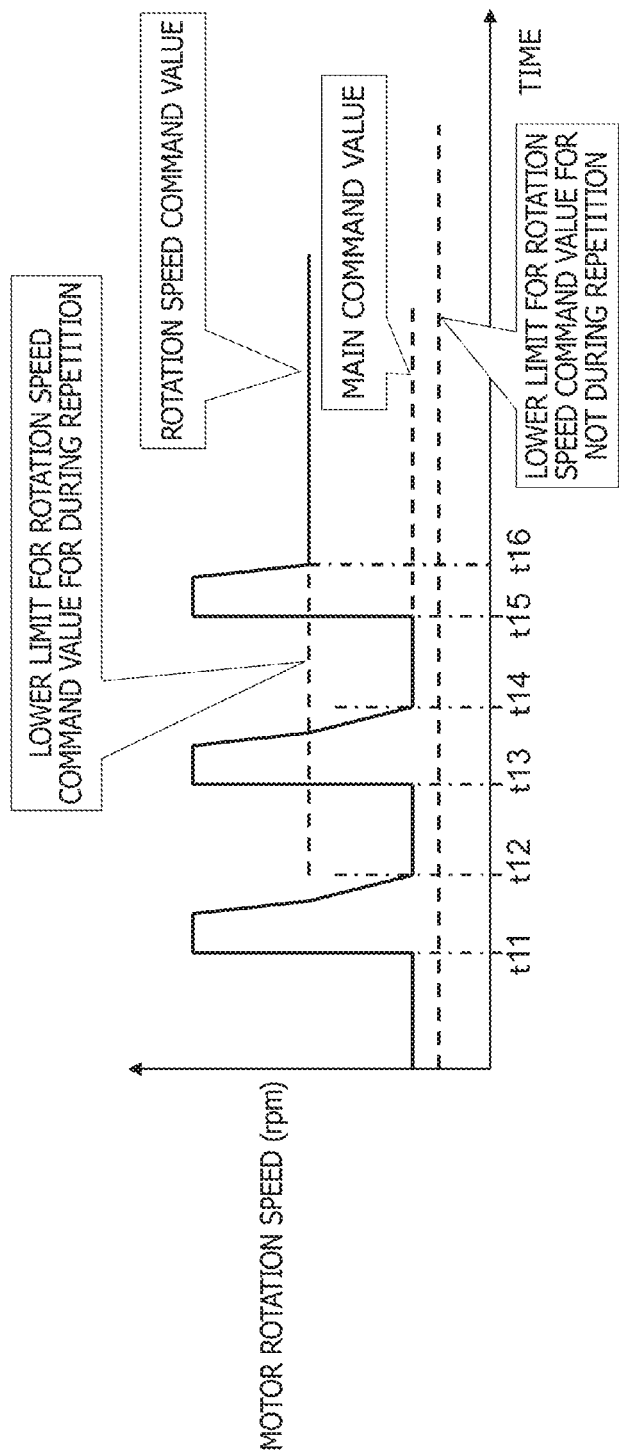
FIG. 10 is a time chart exemplifying how the command value of the rotation speed is changed by the processing for preventing or reducing the repetition of the stop and reactivation of the brushless motor according to an embodiment of the present invention.

The time chart of FIG. 10 exemplifies how the lower limit for the command value of the rotation speed is changed by the processing illustrated in the flowchart of FIG. 9. At time point t11, in response to motor stop, the increasing correction processing of the command value of the rotation speed is performed as the increasing correction processing of the applied voltage. As a result of the processing, brushless motor 45 is reactivated, and the command value of the rotation speed is returned to the main command value at time point t12. After that, however, brushless motor 45 stops again and the increasing correction processing of the command value of the rotation speed is performed again at time point t13.

Then, brushless motor 45 is reactivated, and the command value of the rotation speed is returned to the main command value at time point t14. After that, however, brushless motor 45 stops again and the increasing correction processing of the command value of the rotation speed is performed again at time point t15. As a result, it is determined that the stop and reactivation of brushless motor 45 are alternately repeated, and the increasing correction processing of the lower limit for the command value of the rotation speed is performed. Then, at time point t16, control unit 213 returns to the normal control, and the lower limit for the command value of the rotation speed is set higher than the main command value.

The technical concepts described in the above embodiment may be used in combination with each other as necessary as long as no conflict arises. In other words, any ones of the increasing correction of the command value of the rotation speed, the increasing correction of the command value of the rotation speed, the reducing correction of the measurement value of the rotation speed, and the increasing correction of the command value of the applied voltage may be performed in parallel with each other.

Although the invention has been described in detail with reference to the preferred embodiment, it is apparent that the invention may be modified into various forms by one skilled in the art based on the fundamental technical concept and teachings of the invention. For example, although brushless motor 45 is used as an actuator of electric water pump 40 in the above embodiment, it is apparent that the similar effects as above may be provided by performing the processing as above for another brushless motor used as, for example, an actuator of an oil pump. Thus, the use of brushless motor 45 is not limited to an actuator of electric water pump 40.

As a further alternative, when electric water pump 40 is reactivated from a temporary stop, control unit 213 may avoid using, as the basis for performing the control, the cooling water temperature measured during the stop and during a predetermined period immediately after the reactivation. Alternatively, control unit 213 may estimate changes in cooling water temperature during the stop and during a predetermined period immediately after the reactivation, and perform control based on the estimated cooling water temperature.

Furthermore, in place of correcting and increasing the command value of the applied voltage, control unit 213 may correct and increase the command value of the duty ratio based on the command value of the applied voltage. In other words, when the duration for which the voltage induced in a non-energized phase is maintained unchanged or the duration for which the current energization mode is maintained employed reaches a predetermined time length, control unit 213 may perform any of various types of processing for increasing the input voltage of brushless motor 45 from the input voltage employed when brushless motor 45 stops.

Here, technical concepts which can be grasped from the above embodiment will be disclosed below. According to an aspect of the control device for a brushless motor, the control device having a plurality of energization modes for selecting a phase to be energized by pulse width modulation operation from among a plurality of phases of the brushless motor, and controlling a rotation speed of the brushless motor by switching between the plurality of energization modes based on comparison of a voltage induced in a non-energized phase with a threshold value, the control device comprises a voltage control unit for increasing an input voltage of the brushless motor when a duration for which the induced voltage is maintained unchanged or a duration for which a currently selected one of the energization modes is maintained employed reaches a predetermined time.

In a preferred aspect of the control device, the voltage control unit temporarily corrects and increases a command value of the rotation speed of the brushless motor when the duration for which the induced voltage is maintained unchanged or the duration for which a currently selected one of the energization modes is maintained employed reaches the predetermined time. In another preferred aspect, the voltage control unit corrects and increases whichever is the higher rotation speed of the command value of the rotation speed of the brushless motor and measurement data of the rotation speed of the brushless motor, and uses the corrected rotation speed as a command value for use in controlling the rotation speed of the brushless motor.

In a still another preferred aspect, after the voltage control unit has increased the command value of the rotation speed and then the rotation speed of the brushless motor reaches a predetermined speed, the voltage control unit gradually reduces a corrective addition for correcting and increasing the command value of the rotation speed such that the command value returns to a rotation speed before the increasing correction. In a still another preferred aspect, the voltage control unit increases a lower limit for the command value when the increasing correction of the command value of the rotation speed is repeated.

In a still another preferred aspect, the voltage control unit corrects and reduces measurement data of the rotation speed of the brushless motor and uses the corrected measurement data in controlling the rotation speed, when the duration for which the induced voltage is maintained unchanged or the duration for which a currently selected one of the energization modes is maintained employed reaches the predetermined time. In a still another preferred aspect, the voltage control unit increases the input voltage of the brushless motor for controlling the rotation speed by adding a correction voltage to the input voltage, when the duration for which the induced voltage is maintained unchanged or the duration for which a currently selected one of the energization modes is maintained employed reaches the predetermined time.

According to an aspect of the control method for a brushless motor, the control method including a plurality of energization modes for selecting a phase to be energized by pulse width modulation operation from among a plurality of phases of the brushless motor, and being provided for controlling a rotation speed of the brushless motor by switching between the plurality of energization modes based on comparison of a voltage induced in a non-energized phase with a threshold value, the control method comprises the steps of: measuring a duration for which the induced voltage is maintained unchanged or a duration for which a currently selected one of the energization modes is maintained employed; and increasing an input voltage of the brushless motor when the measured time reaches a predetermined time.

REFERENCE SYMBOL LIST

40 electric water pump
45 brushless motor 100 control device
212 motor driving circuit
213 control unit
213a A/D converter
213b microcomputer
215u, 215v, 215w coil
216 permanent magnet rotor
217a to 217f switching element

The invention claimed is:

1. A control device for a brushless motor, the control device having a plurality of energization modes for selecting a phase to be energized by pulse width modulation operation from among a plurality of phases of the brushless motor, and controlling a rotation speed of the brushless motor by switching between the plurality of energization modes based on comparison of a voltage induced in a non-energized phase with a threshold value, the control device comprising:
   a voltage control unit for measuring a duration for which the induced voltage is maintained unchanged or a duration for which a currently selected one of the energization modes is maintained employed,
   wherein, when the duration measured reaches a predetermined time, the voltage control unit temporarily increases an input voltage of the brushless motor by temporarily correcting and increasing a command value of the rotation speed of the brushless motor.

2. The control device for the brushless motor according to claim 1, wherein the voltage control unit corrects and increases whichever is the higher of the command value of the rotation speed of the brushless motor and measurement data of the rotation speed of the brushless motor, and uses the rotation speed, corrected as the command value, for use in controlling the rotation speed of the brushless motor.

3. The control device for the brushless motor according to claim 1, wherein, after the voltage control unit has increased the command value of the rotation speed and then the rotation speed of the brushless motor reaches a predetermined speed, the voltage control unit gradually reduces a corrective addition for correcting and increasing the command value of the rotation speed such that the command value returns to a rotation speed before the increasing correction.

4. The control device for the brushless motor according to claim 1, wherein the voltage control unit increases a lower limit for the command value when the increasing correction of the command value of the rotation speed is repeated.

5. A control method for a brushless motor, the control method including a plurality of energization modes for selecting a phase to be energized by pulse width modulation operation from among a plurality of phases of the brushless motor, and being provided for controlling a rotation speed of the brushless motor by switching between the plurality of energization modes based on comparison of a voltage induced in a non-energized phase with a threshold value, the control method comprising:
   measuring a duration for which the induced voltage is maintained unchanged or a duration for which a currently selected one of the energization modes is maintained employed; and
   temporarily increasing an input voltage of the brushless motor by temporarily correcting and increasing a command value of the rotation speed of the brushless motor when the duration measured reaches a predetermined time.

* * * * *